(12) United States Patent
Mei et al.

(10) Patent No.: US 10,665,797 B2
(45) Date of Patent: May 26, 2020

(54) HYBRID HALIDE PEROVSKITE-BASED FIELD EFFECT TRANSISTORS

(71) Applicants: WAKE FOREST UNIVERSITY, Winston-Salem, NC (US); University of Utah Research Foundation, Salt Lake City, UT (US)

(72) Inventors: Yaochuan Mei, Winston-Salem, NC (US); Oana Diana Jurchescu, Winston-Salem, NC (US); Zeev Valentine Vardeny, Salt Lake City, UT (US); Chuang Zhang, Salt Lake City, UT (US)

(73) Assignees: WAKE FOREST UNIVERSITY, Winston-Salem, NC (US); UNIVERSITY OF UTAH RESEARCH FOUNDATION, Salt Lake City, UT (US)

( * ) Notice: Subject to any disclaimer, the term of this patent is extended or adjusted under 35 U.S.C. 154(b) by 0 days.

(21) Appl. No.: 15/774,944

(22) PCT Filed: Nov. 9, 2016

(86) PCT No.: PCT/US2016/061163
§ 371 (c)(1),
(2) Date: May 9, 2018

(87) PCT Pub. No.: WO2017/083408
PCT Pub. Date: May 18, 2017

(65) Prior Publication Data
US 2018/0351121 A1    Dec. 6, 2018

Related U.S. Application Data

(60) Provisional application No. 62/252,871, filed on Nov. 9, 2015.

(51) Int. Cl.
  *H01L 51/00*    (2006.01)
  *H01L 51/05*    (2006.01)
  *H01L 51/10*    (2006.01)

(52) U.S. Cl.
  CPC ........ *H01L 51/0566* (2013.01); *H01L 51/052* (2013.01); *H01L 51/0558* (2013.01);
  (Continued)

(58) Field of Classification Search
  CPC ............. H01L 51/0566; H01L 51/0558; H01L 51/052; H01L 51/105; H01L 51/0541;
  (Continued)

(56) References Cited

U.S. PATENT DOCUMENTS

| | | | |
|---|---|---|---|
| 6,180,956 B1* | 1/2001 | Chondroudis | H01L 51/0541 257/40 |
| 6,344,662 B1* | 2/2002 | Dimitrakopoulos | H01L 21/2007 257/289 |
| 7,285,440 B2* | 10/2007 | Dimitrakopoulos | B82Y 15/00 257/E51.007 |
| 7,993,959 B2* | 8/2011 | Katz | H01L 27/283 257/E21.414 |

(Continued)

FOREIGN PATENT DOCUMENTS

WO    2015032748 A1    3/2015

OTHER PUBLICATIONS

International Search Report and Written Opinion corresponding to PCT/US2016/061163, dated Feb. 10, 2017, 9 pages.

(Continued)

*Primary Examiner* — Vu A Vu
(74) *Attorney, Agent, or Firm* — J. Clinton Wimbish; Nexsen Pruet PLLC

(57)    ABSTRACT

In one aspect, field effect transistors are described herein employing channels formed of hybrid halide perovskite
(Continued)

materials. For example, a field effect transistor comprises a source terminal, a drain terminal and a gate terminal wherein a dielectric layer is positioned between the gate terminal and the source and drain terminals. A channel layer is in electrical communication with the source terminal and the drain terminal, the channel layer comprising an organic-inorganic perovskite in contact with a polymeric surface of the dielectric layer.

29 Claims, 8 Drawing Sheets

(52) U.S. Cl.
CPC .......... *H01L 51/105* (2013.01); *H01L 51/004* (2013.01); *H01L 51/005* (2013.01); *H01L 51/0077* (2013.01); *H01L 51/0541* (2013.01); *H01L 51/0545* (2013.01)

(58) Field of Classification Search
CPC . H01L 51/005; H01L 51/0077; H01L 51/004; H01L 51/0545
USPC .......................................................... 257/40
See application file for complete search history.

(56) References Cited

U.S. PATENT DOCUMENTS

| | | | | |
|---|---|---|---|---|
| 8,686,404 | B2* | 4/2014 | Kagan | H01L 51/105 257/351 |
| 2005/0156208 | A1* | 7/2005 | Lin | H01L 21/823814 257/288 |
| 2012/0302682 | A1* | 11/2012 | Wei | C09C 1/028 524/161 |
| 2015/0380660 | A1* | 12/2015 | Gryko | H01L 51/0071 252/500 |
| 2018/0248118 | A1* | 8/2018 | Kwok | H01L 51/42 |

OTHER PUBLICATIONS

Kagan, C.R, et al., Organic-Inorganic Hybrid Materials as Semiconducting Channels in Thin-Film Field-Effect Transistors, Science, American Association for the Advancement of Science, vol. 286, Oct. 29, 1999, pp. 945-947, XP 000993296.

Chin, Xin Yu et al., Lead Iodide Perovskite Light-Emitting Field-Effect Transistor, Nature Communications, vol. 6, Jun. 25, 2015, pp. 1-9, XP55341364, United Kingdom.

Chen, Qi et al., Under the Spotlight: The Organic-Inorganic Hybrid Halide Perovskite for Optoelectronic Applications, Nano Today, vol. 10, No. 3, Jun. 1, 2015, pp. 355-396, XP55341334, NL.

* cited by examiner

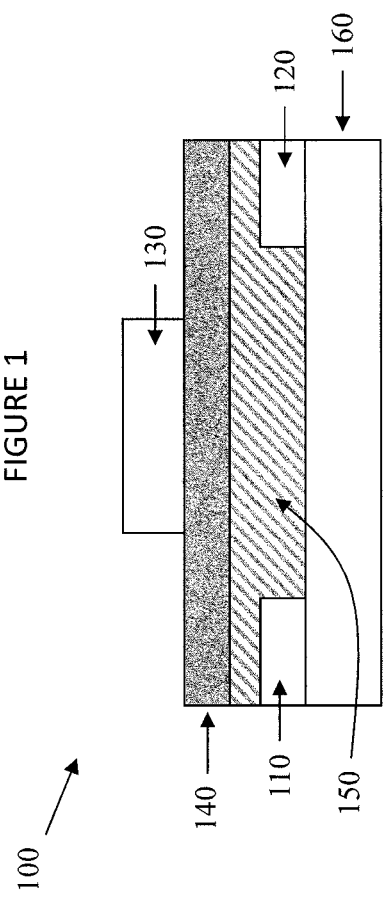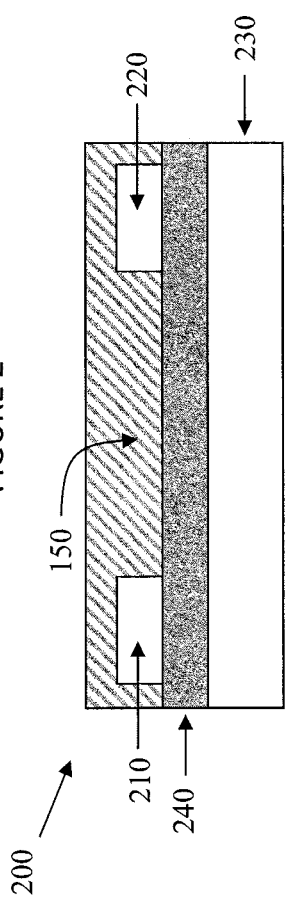

HYBRID HALIDE PEROVSKITE-BASED FIELD EFFECT TRANSISTORS

RELATED APPLICATION DATA

This application is a U.S. National Phase of PCT/US2016/061163, filed Nov. 9, 2016, which claims priority pursuant to 35 U.S.C. § 119(e) to U.S. Provisional Patent Application Ser. No. 62/252,871 filed Nov. 9, 2015, each of which is hereby incorporated by reference in their entireties.

STATEMENT OF GOVERNMENT RIGHTS

This invention was made with government support under contracts N00014-15-1-2943 and N00014-15-1-2524 awarded by the Office of Naval Research. The government has certain rights in the invention.

FIELD

The present invention relates to field effect transistors and, in particular, to field effect transistors employing channels formed of perovskite materials.

BACKGROUND

Inorganic perovskite materials have attracted significant research effort given their rich physical properties that include high-temperature superconductivity, colossal magnetoresistance, ferroelectricity, diverse magnetic properties, etc. Their structure has the general formula $ABX_3$, where the cation B resides in the center of corner sharing $BX_6$ octahedra, whereas cation A is surrounded by eight such octahedra (see, for example, $SrTiO_3$, $YMnO_3$, $YVO_3$, and $LaMnO_3$). The newest member of the perovskite family, namely the organic-inorganic perovskites, have recently emerged as an intriguing class of materials, which combine the low-cost processing and versatility characteristics of organic materials with the performance factors of inorganic compounds. For example, the power conversion efficiency of hybrid perovskite photovoltaic (PV) solar cells has exceeded 20%, and the light-emitting diodes (LEDs) based on these compounds rival the best on the market. In addition, hybrid perovskite semiconductors exhibit wavelength-tunable photoluminescence (PL), laser action and charge carrier diffusion lengths of the order of hundreds of micrometers. Surprisingly, these compounds also show interesting spin-related properties, including magneto-photocurrent, magneto-electroluminescence, and magneto-PL, in spite of their fast spin relaxation that is due to the strong spin-orbit coupling.

The most exciting breakthroughs of hybrid halide perovskites are without a doubt in the area of PV technologies, where the new records in power conversion efficiencies have been reported at an unprecedented pace; in few years from the first report, efficiency has improved by more than five times. However, hybrid halide perovskites have found limited relevance to electronic applications outside the PV arena. Despite the promising performance characteristics described above, hybrid halide perovskites can be sensitive to various environmental conditions leading to discontinuities in electronic structure, premature operational degradation and limited lifetimes.

SUMMARY

In one aspect, field effect transistors are described herein employing channels formed of hybrid halide perovskite materials. For example, a field effect transistor comprises a source terminal, a drain terminal and a gate terminal wherein a dielectric layer is positioned between the gate terminal and the source and drain terminals. A channel layer is in electrical communication with the source terminal and the drain terminal, the channel layer comprising an organic-inorganic perovskite in contact with a polymeric surface of the dielectric layer. In some embodiments, the perovskite is an organic-inorganic halide perovskite. For example, such a perovskite can be of the formula $ABX_{1-z}Y_z$, wherein A is an organic cation, B is an element selected from the group consisting of transition metals, Group IVA elements and rare earth elements and X and Y are independently selected from Group VIIA elements, wherein $0 \leq z < 1$.

In another aspect, methods of fabricating field effect transistors are described herein. In some embodiments, a method comprises providing a source terminal, drain terminal and gate terminal and positioning a dielectric layer between the gate terminal and the source and drain terminals. A channel layer is deposited to extend between the source and drain terminals, the channel layer comprising an organic-inorganic perovskite in contact with a polymeric surface of the dielectric layer. As described above, the deposited perovskite can be an organic-inorganic halide perovskite.

These and other embodiments are further described in the following detailed description.

BRIEF DESCRIPTION OF THE DRAWINGS

FIG. 1 illustrates structure of a field effect transistor according to some embodiments described herein.

FIG. 2 illustrates structure of a field effect transistor according to some embodiments described herein.

DETAILED DESCRIPTION

Figure 3:
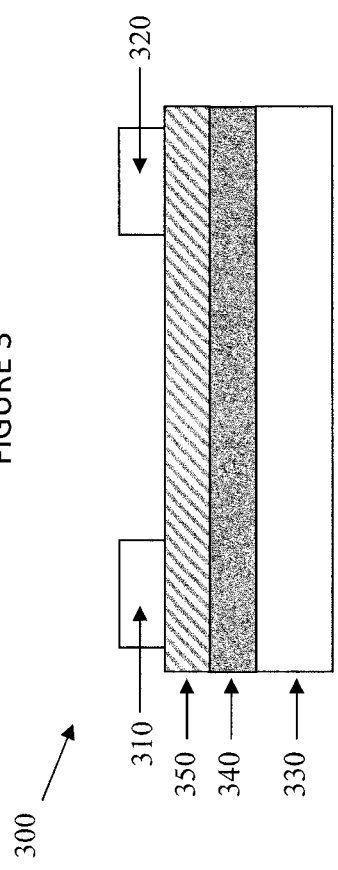
FIG. 3 illustrates structure of a field effect transistor according to some embodiments described herein.

Embodiments described herein can be understood more readily by reference to the following detailed description and examples and their previous and following descriptions. Elements and apparatus described herein, however, are not limited to the specific embodiments presented in the detailed description. It should be recognized that these embodiments are merely illustrative of the principles of the present invention. Numerous modifications and adaptations will be readily apparent to those of skill in the art without departing from the spirit and scope of the invention.

As described herein, a field effect transistor comprises a source terminal, a drain terminal and a gate terminal wherein a dielectric layer is positioned between the gate terminal and the source and drain terminals. A channel layer is in electrical communication with the source terminal and the drain terminal, the channel layer comprising an organic-inorganic perovskite in contact with a polymeric surface of the dielectric layer. As illustrated in FIGS. 1 through 4, the foregoing components can be arranged in various formats to provide field effect transistors. FIG. 1, for example, illustrates the structure of a field effect transistor according to one embodiment described herein. A dielectric layer (140) is positioned between the gate terminal (130) and the source and drain terminals (110, 120). An organic-inorganic perovskite channel layer (150) is in electrical communication with the source terminal (110) and the drain terminal (120). The channel layer (150) is positioned between the source and drain terminals (110, 120) and contacts the dielectric layer (140). If desired, a work function alteration layer (not shown) can be positioned between the source terminal (110) and the channel layer (150) and/or between the drain terminal (120) and the channel layer (150). In the embodiment of FIG. 1, the field effect transistor (100) further comprises an insulating substrate (160) adjacent to the source and drain terminals (110, 120). Any insulating substrate not inconsistent with the objectives of the present invention may be used. In some embodiments, insulating substrate (160) comprises glass such as $SiO_2$.

In an alternative embodiment, the gate and/or dielectric layer can provide sufficient support for the field effect transistor as illustrated in FIG. 2. A dielectric layer (240) is positioned between the gate terminal (230) and the source and drain terminals (210, 220). An organic-inorganic perovskite channel layer (250) is in electrical communication with the source terminal (210) and drain terminal (220). If desired, a work function alteration layer (not shown) can be positioned between the source terminal (210) and the channel layer (250) and between the drain terminal (220) and the channel layer (250).

The various components of field effect transistors described herein are not necessarily limited to the structures of FIGS. 1 and 2. Other device structures not inconsistent with the objectives of the present invention may also be used. FIG. 3 illustrates another structure of field effect transistor according to one embodiment described herein. The field effect transistor (300) comprises source (310) and drain (320) terminals over and in electrical communication with the organic-inorganic perovskite channel layer (350). A dielectric layer (340) is positioned between the channel layer (350) and gate terminal (330). If desired, a work function alteration layer (not shown) can be positioned between the source terminal (310) and the channel layer (350) and/or between the drain terminal (320) and the channel layer (350).

Figure 4:
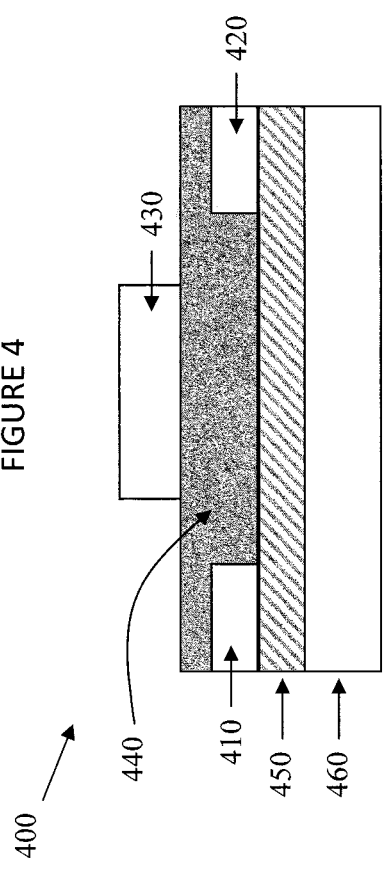
FIG. 4 illustrates structure of a field effect transistor according to some embodiments described herein.

FIG. 4 illustrates another structure of field effect transistor according to one embodiment described herein. The field effect transistor (400) comprises source (410) and drain (420) terminals over and in electrical communication with an organic-inorganic perovskite channel layer (450). A dielectric layer (440) is positioned between the gate terminal (430) and source and drain terminals (410, 420). If desired, a work function alteration layer (not shown) can be positioned between the source terminal (410) and the channel layer (450) and/or between the drain terminal (420) and the channel layer (450).

Turning now to specific components, field effect transistors described herein comprise a source terminal and a drain terminal. The source and drain terminals can comprise any material suitable for a source and drain, such as metal or alloy. In some embodiments, for example, the source and/or drain terminals are gold, silver, copper, titanium or aluminum or alloys thereof. Source and drain terminals can also have any physical dimensions not inconsistent with the objectives of the present invention. In some embodiments, for example, a source and/or drain terminal has a thickness of about 10 nm to about 200 nm. In some embodiments, a source and/or drain terminal has a thickness of about 20 nm to about 150 nm, or about 30 nm to about 100 nm. Alternatively, a source and/or drain terminal can have a thickness greater than about 200 nm. Moreover, one or more dimensions of a source and/or drain terminal can be selected to achieve a desired channel length or width in the organic film.

Field effect transistors described herein also comprise a gate terminal. In some embodiments, a gate terminal is metal, including pure metals or various alloys. For example, a metal gate terminal can be gold, silver, copper or aluminum. Alternatively, a gate terminal is a semiconductor, such as p-doped or n-doped silicon. A gate terminal can also have any physical dimensions not inconsistent with the objectives of the present invention. In some embodiments, for example, a gate terminal has a thickness of about 500 µm to about 1 mm.

In some embodiments, a field effect transistor described herein further comprises a work function alteration layer positioned between the organic-inorganic perovskite channel layer and at least one of the source terminal and drain terminal. Any work function alteration layer not inconsistent with the objectives of the present invention may be used. A work function alteration layer, in some embodiments, is operable to alter the work function or charge injection of a source and/or drain terminal. In some embodiments, for example, a work function alteration layer assists in reconciling the electronic structure of the source or drain terminal with the organic-inorganic perovskite, thereby improving charge injection and/or withdrawal.

In some embodiments, a work function alteration layer comprises a self-assembled monolayer (SAM) formed between a terminal and the perovskite layer. Moreover, a SAM can comprise a small molecule monolayer. In some embodiments, a work function alteration layer comprises a SAM of a fluorinated compound, such as a fluorinated thiol including 2,3,5,6-tetrafluoro-4-(trifluoromethyl)benzenethiol (TTFB). In another embodiment, the SAM comprises one or more non-fluorinated thiols. Use of a work function alteration layer described herein can enhance carrier mobility of the transistor.

A field effect transistor described herein also comprises a dielectric layer positioned between the gate terminal and the source and drain terminals. Any dielectric layer not inconsistent with the objectives of the present invention may be used. In some embodiments, for example, a dielectric layer is formed from an organic material, such as a dielectric organic polymer. Suitable dielectric polymeric materials can include various fluoropolymers. In some embodiments, for example, the dielectric layer comprises amorphous fluoropolymer or amorphous perfluorinated polymer, such as the CYTOP® polymer line commercially available from Asahi Glass Co., Ltd. Additional suitable fluoropolymers include, but are not limited to, polytetrafluoroethylene (PTFE), fluorinated ethylene propylene (FEP), polyvinylfluoride (PVF), polyvinylidene fluoride (PVDF), poly(vinylidenefluoride-trifluoroethylene P(VDF-TrFE) or mixtures thereof. In some embodiments, the dielectric layer separating the gate terminal from the source and drain terminals comprises a polymer electret. In being an electret, the polymeric material is dielectric exhibiting quasi-permanent charge or quasi-permanent electric field. Suitable polymer electrets can include any of the fluoropolymers recited herein. Additional polymer electrets comprise polyethylene, polypropylene, polyethylene terephthalate (PET), polyvinyl alcohol, polyimides, ethylene vinyl acetate (EVA), polymethylmethacryalte (PMMA), fluorinated parylene or mixtures thereof. Surface charge density of polymer electrets can be tailored to enhance hole and/or electron mobility of the organic-inorganic perovskite channel layer described herein. In some embodiments, a polymer electret can have a surface charge density of 0.1 mC/cm² to 2 mC/cm². In other embodiments, a polymer electret exhibits surface charge density of less than 0.1 mC/cm². Surface charge density of polymer electret, in some embodiments, is tailored by one more techniques, including functionalization of the polymer with one or more pendant groups and/or end groups. CYTOP® fluoropolymer, for example, can be fabricated to terminate in several different groups including trifluoromethyl (CTL-S), carboxyl (CTL-A) and amidosilyl (CTL-M). Pendant functional groups can include alkyl, cycloalkyl, aryl, heteroaryl, ether, ester, ketone and/or hydroxyl moieties. In other embodiments, surface charge density of polymer electret can be tailored by exposure of the polymer to plasma or other oxidative species. Use of polymer electrets in the dielectric layer contacting the organic-inorganic perovskite channel may enable production of organic field effect transistor memory devices. Such memory devices can find application in NAND flash memory, for example.

The dielectric layer positioned between the gate terminal and the source and drain terminals can be of single layer construction. For example, the dielectric layer can be formed of a single layer of any dielectric polymer, including dielectric polymeric species described herein. Alternatively, the dielectric layer can comprise a multilayer construction. The dielectric layer can comprise any number of material layers not inconsistent with the objectives of the present invention. In some embodiments, the dielectric layer comprises two or more layers of dielectric polymer. By comprising multiple layers of polymer, the dielectric layer can exhibit a dielectric gradient. Dielectric constant (K) of the layer, in some embodiments, increases in a direction moving away from the interface with the perovskite channel layer. In other embodiments, dielectric constant decreases in a direction moving away from the interface with the perovskite channel layer. The dielectric gradient can be controlled by compositional identity of the individual layers. For example, a polymer electret of the dielectric layer can reside at the interface with the channel layer. In some embodiments, the dielectric layer is completed by one or more layers of polymeric material adjacent to the polymer electret.

The dielectric layer, in further embodiments, can comprise one or more polymeric layers and one or more layers of inorganic material. The dielectric layer can comprise an inorganic substrate coated with one or more layers of dielectric polymer. In such embodiments, the polymeric coating is arranged to contact the organic-inorganic perovskite channel layer. Differences in dielectric constant between the inorganic substrate, such as glass, alumina or other ceramic, and the polymeric material can establish a dielectric gradient as described herein.

Figure 5:
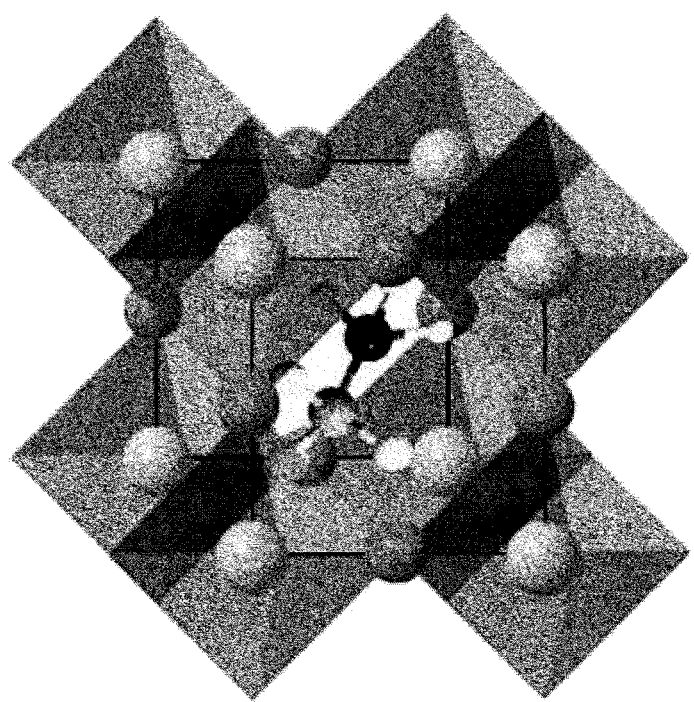
FIG. 5 illustrates crystal structure of an organic-inorganic halide perovskite of the channel layer according to some embodiments described herein.

The organic-inorganic perovskite channel layer is in electrical communication with the source and drain terminals and is in contact with a polymeric surface of the dielectric layer. In some embodiments, the perovskite is an organic-inorganic halide perovskite. For example, the perovskite can be of the formula $ABX_{1-z}Y_z$, wherein A is an organic cation, B is an element selected from the group consisting of transition metals, Group IVA elements and rare earth elements and X and Y are independently selected from Group VIIA elements, wherein $0 \leq z < 1$. In some embodiments, X and Y are different to provide a mixed halide organic-inorganic perovskite. In other embodiments, X and Y are the same halogen. Organic cation A can be any organic cation compatible with interstitial spaces of the inorganic perovskite structure. In some embodiments, organic cation A is selected form the group consisting of $NH_4^+$, $CH_3NH_3^+$, $CH_3CH_2NH_3^+$ and $NH_2CH=NH_2^+$. FIG. 5 illustrates crystal structure of an organic-inorganic halide perovskite of formula $CH_3NH_3PbI_{3-x}Cl_x$ employed as a channel layer according to one embodiment described herein. The lead and halide atoms sit a centers and corners of the octahedron, respectively, and the organic cation resides in the interstices.

In some embodiments, the channel layer is formed of a two-dimensional (2D) organic-inorganic perovskite composition. For example, organic cation A can comprise $C_6H_5C_2H_4NH_3^+$, $C_6H_5NH_3^+$ and/or $C_6H_5NH_3^+$ to form an intercalated 2D organic-inorganic layer structure. In such embodiments, metal atom B and its six neighboring halide atoms (X) form a $BX_6^{4-}$ octahedron. Inorganic layers are formed by neighboring octahedra sharing halide atoms. The organic-ammonium cations (A) can bind to and separate the inorganic layers forming an intercalated 2D organic-inorganic layer structure.

The organic-inorganic perovskite can exhibit polycrystalline morphology. In some embodiments, the organic-inorganic perovskite has a grain size of at least 200 nm. For example, the organic-inorganic perovskite can have a grain size of 200 nm to 2 μm. Alternatively, the organic-inorganic perovskite can be single-crystalline. Moreover, the organic-inorganic perovskite can exhibit surface roughness less than 100 nm or less than 70 nm. As detailed in the examples herein, surface roughness is determined with AFM techniques.

A channel layer employing the organic-inorganic perovskite can have any dimensions not inconsistent with the present invention. In some embodiments, the channel has width of 200 μm to 1000 μm and length of 5 μm to 100 μm. Further, the channel can have thickness of 200 nm to 500 nm.

Field effect transistors described herein can be ambipolar exhibiting electron (p) and hole ($\mu_h$) mobilities. For example, in some embodiments, a field effect transistor can exhibit mobilities selected from Table I.

TABLE I

| Carrier Mobility (cm²/Vs) | |
| --- | --- |
| $\mu_e$ | $\mu_h$ |
| ≥1 | ≥1 |
| ≥5 | ≥5 |
| ≥10 | ≥10 |
| 1-200 | 1-200 |
| 10-200 | 10-200 |

As detailed in the examples herein, $\mu_e$ and/or $\mu_h$ mobility can exhibit temperature dependence, wherein mobility increases with decreasing temperature. In some embodiments, a field effect transistor exhibits carrier mobility of 10-100 cm$^2$/Vs at temperature of 50-150 K. Additionally, a field effect transistor described herein can exhibit a threshold voltage ($V_T$) of 5V to 15V for electron carriers and −5V to −15V for hole carriers.

Moreover, in some embodiments, a field effect transistor described herein has a subthreshold swing (S) of less than about 1 V/dec for holes ($S_h$) and electrons ($S_e$). In some embodiments, $S_e$ and/or $S_h$ is 0.1 to 1 V/dec or 0.5 to 1 V/dec. Subthreshold swing can be calculated by finding the inverse of the slope of the linear fit line of the plot of log($I_D$) versus $V_{GS}$ in the saturation regime. Further, a field effect transistor described herein can exhibit an on/off ratio of 1×10$^4$ to 1×10$^5$, in some embodiments.

In another aspect, methods of fabricating field effect transistors are described herein. In some embodiments, a method comprises providing a source terminal, drain terminal and gate terminal and positioning a dielectric layer between the gate terminal and the source and drain terminals. A channel layer is deposited to extend between the source and drain terminals, the channel layer comprising an organic-inorganic perovskite in contact with a polymeric surface of the dielectric layer. As provided above, the deposited perovskite can be an organic-inorganic halide perovskite. The organic-inorganic perovskite channel can be deposited by several techniques. In some embodiments, for example, the organic-inorganic perovskite can be deposited by solution techniques including spin coating or spay deposition. In such embodiments, a solution of metal halide and organic halide is employed for spin coating or spray deposition. Metal halide of the solution can be a singular species or a mixture of metal halide species. Moreover, halide of the metal and organic cation can be different to produce perovskite of mixed halide composition.

In alternative embodiments, the organic-inorganic perovskite channel can be deposited by thermal evaporation. In such embodiments, a metal halide source and organic halide source are independently placed in a deposition chamber and evaporated by heating. One or more substrates are also positioned in the deposition chamber for co-deposition of the organic and inorganic components for hybrid perovskite formation. Evaporation rates of the metal and organic halides can generally be controlled at 0.1 Å/s to 2 Å/s, and the deposition chamber held under vacuum conditions. Further, the substrate can be continuously or periodically rotated during the thermal deposition process.

Field effect transistors made according to methods described herein can exhibit any construction and/or properties described hereinabove.

Example 1—Field Effect Transistor

Figure 6:
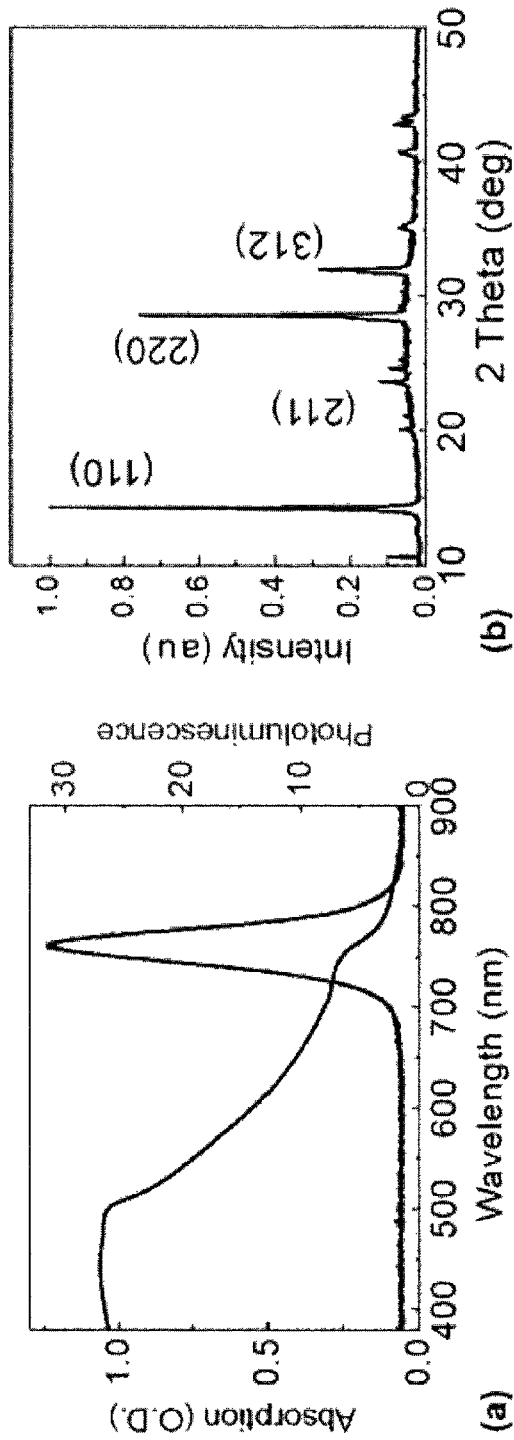
FIG. 6(a) illustrates UV-Vis absorption and photoluminescence of an organic-inorganic halide perovskite of a channel layer and FIG. 6(b) is an X-ray diffractrogram of the organic-inorganic halide perovskite according to one embodiment described herein.

A bottom contact, top-gated field effect transistor was fabricated on Au-patterned source and drain electrodes that were placed on an insulating substrate as generally illustrated in the schematic of FIG. 1. The contacts were defined by photolithography and deposited using e-beam evaporation lift-off. The substrate was cleaned in hot acetone and hot isopropyl alcohol, followed by UV-ozone and deionized water rinse. Prior to the deposition of the organic-inorganic perovskite channel layer, the electrodes were treated with 2,3,5,6-tetrafluoro-4-(trifluoromethyl)benzenethiol (TTFP) self-assembled monolayer (SAM) by immersing the substrate in a 50 mM solution in ethanol for 30 minutes, followed ultrasonication in ethanol for 2 minutes. Subsequently, the perovskite layer was deposited from a precursor solution obtained by mixing 0.8 g of CH$_3$NH$_3$I with 0.23 g of PbI$_2$ and 0.42 g of PbCl$_2$ in 2.5 mL N,N-dimethylformamide (DMF) solvent. The obtained solution was allowed to stir overnight on the hotplate 70° C. in a nitrogen-filled glove-box (H$_2$O, O$_2$<1 ppm). Once cooled to room temperature, the bright yellow solution was spin coated on the pre-fabricated transistor substrate at 2000 rpm, a process that took place in the same glove-box. Subsequently, the films were annealed at 90° C. for 15 minutes, followed by a second annealing step at 105° C. for 120 minutes. This resulted in a change in color to dark brown, indicating the formation of the CH$_3$NH$_3$PbI$_{3-x}$Cl$_x$ perovskite channel layer. This was also confirmed by the UV-Vis absorption and PL emission spectra from the perovskite as illustrated in FIG. 6(a). The perovskite layer was also characterized by XRD as shown in FIG. 6(b).

For the gate dielectric, a fluoropolymer (CYTOP®-Asahi Glass) layer was deposited from an undiluted solution by spin coating in a nitrogen glove-box. The samples were subsequently annealed at 50° C. overnight in vacuum oven to ensure cross-linking of the dielectric layer. Finally, Al-top gate terminal was deposited by thermal evaporation through a shadow mask.

Figure 7:
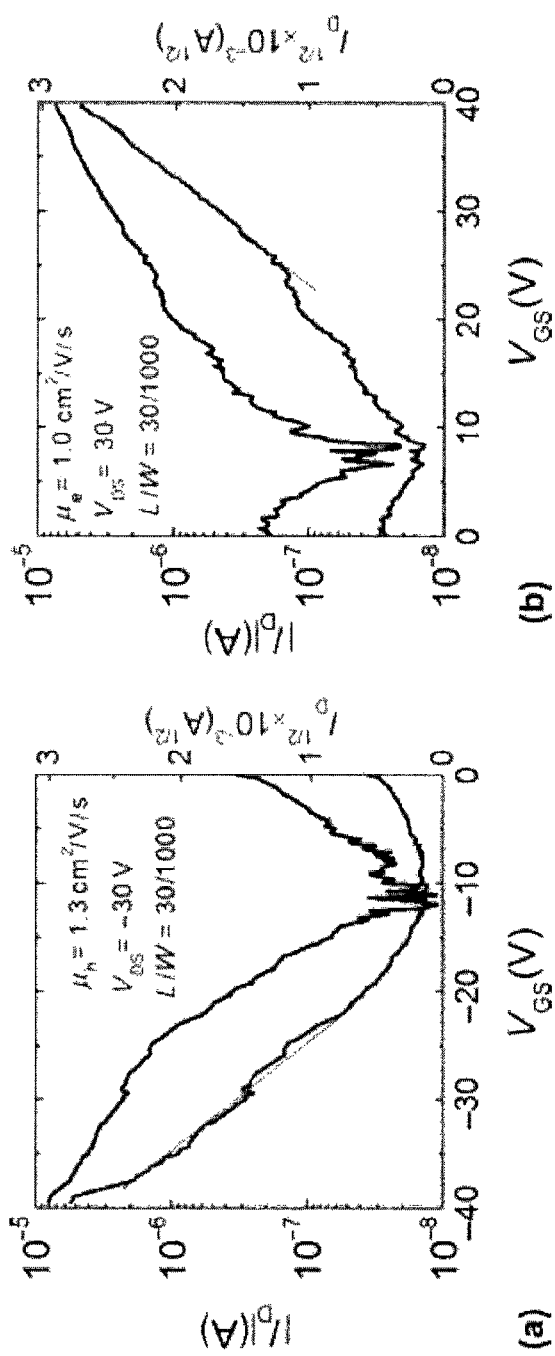
FIGS. 7(a) and 7(b) illustrate I-V characteristics for p-type transport and n-type transport of a field effect transistor according to some embodiments described herein.

FIGS. 7(a) and 7(b) show current-voltage (I-V) characteristics for the field effect transistor having channel length, L=30 μm and channel width, W=1000 μm. All measurements were performed in air using an Agilent 4155C semiconductor parameter analyzer (with a voltage step of 0.2 V and using short integration time to minimize the bias stress effects). In FIG. 7(a), the I-V characteristics were measured at a source-drain voltage, $V_{DS}$=−30V, where p-type transport was detected. The relatively noisy nature of the curves most probably originates from the fact that the measurement was fast, to prevent degradation due to bias stress. A hole mobility, $\mu_h$=1.3 cm$^2$/Vs was calculated form the square-root dependence of the drain current $I_D$ versus the applied source-gate voltage, $V_{GS}$ using the equation below, below where $C_i$ is the dielectric capacitance per unit area ($C_i$=1.3 nF/cm), estimated based on 1.4 μm dielectric thickness, and using a dielectric constant value of $\varepsilon_r$=2.05:

$$\mu_h = \frac{2L}{WC_i}\left(\frac{\partial \sqrt{I_D}}{\partial V_{GS}}\right)^2$$

The on/off ratio and the subthreshold slope, S, extracted from this I-V dependence were measured to be on/off=10$^2$ and S=2.1 V/dec, respectively. The field effect transistor also exhibited electron transport [FIG. 7(b)] with an extracted mobility of $\mu_e$=1.0 cm$^2$N/Vs, on/off ratio of 10$^2$ and S=1.5 V/dec.

Figure 8:
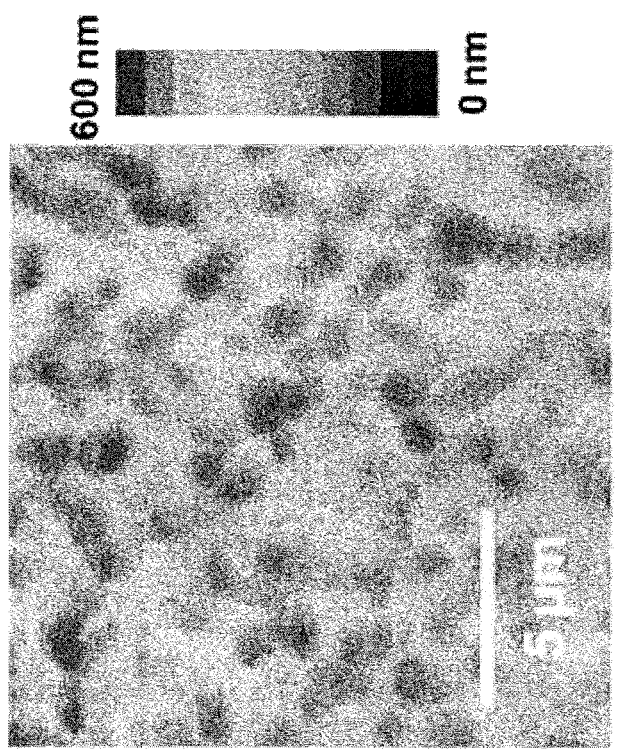
FIG. 8 provides atomic force microscopy (AFM) measurements of an organic-inorganic halide perovskite channel layer according to some embodiments described herein.
Figure 9:
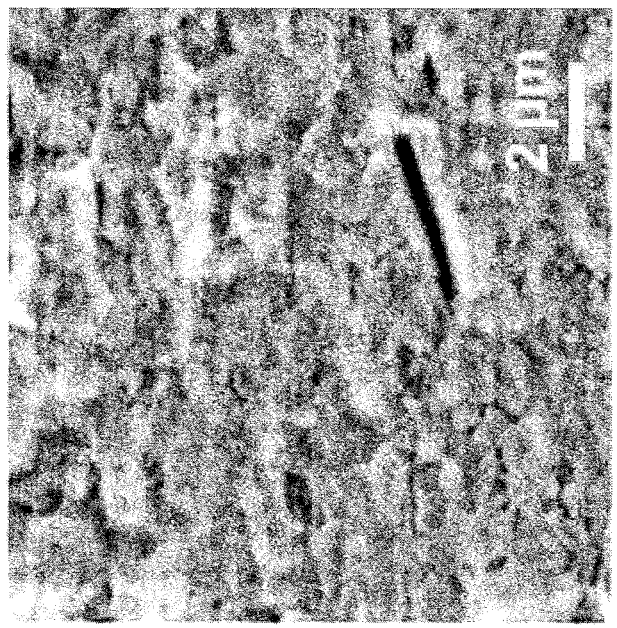
FIG. 9 is a scanning electron microscopy (SEM) image of an organic-inorganic halide perovskite of a channel layer according to one embodiment described herein.

The field effect mobility values extracted from the obtained I-V measurements were lower than those measured using other electrical methods. The reason being that charge carrier transport in field effect transistors is not only related to the quality of the perovskite, but also to processes that occur at the channel/dielectric interface, where interface states and low coordination bonds or dangling bonds may also impact conductivity. Excess roughness at this interface can also increase charge carrier scattering, which results in lower mobility. In addition, charge trapping at the grain boundaries is known to inhibit charge transport. The organic-inorganic halide perovskite of the present example displayed surface roughness of 70±10 nm, determined form AFM measurements provided in FIG. 8. Grain size and morphology of the organic-inorganic perovskite are illustrated in the SEM of FIG. 9. From the SEM, grain size was on the order of hundreds of nm.

Example 2—Co-Evaporation Preparation of MAPbI$_3$ Thin Films

To thermally evaporate MAPbI$_3$ films, two crucibles with PbI$_2$ and MAI powders were placed separately in heating units in the deposition chamber. In a typical preparation, PbI$_2$ and MAI were degassed and then heated to ~290° C. and ~90° C., respectively. The evaporation rates were controlled at 0.2 Å/s and 1.0 Å/s for PbI$_2$ and MAI with a volume ratio of 1:5. The vapor pressure was on the order of 10$^6$ Torr during the deposition. The sample holder was rotating all the time and heated to 70° C. (in situ annealing) during the entire process. After the deposition, the samples were post-annealed at 70° C. in the chamber for 30 mins, and then taken out for further characterization.

Example 3—Spray Deposition of Organic-Inorganic Perovskite

The solution needed for spray-deposition was obtained by mixing 0.8 g of CH$_3$NH$_3$I (Dyenamo) with 0.69 g of PbI$_2$ and 0.28 g of PbCl$_2$ (Sigma Aldrich) in 5 mL N,N-dimethylformamide solvent and stirring overnight at 70° C. in N$_2$ atmosphere. Si/SiO$_2$ Substrate was heated to 105° C. prior to spray deposition. Hand-held atomization device (Naloxone MAD 140) was kept at a height of 20 cm from substrate and the spray-deposition was performed in a N$_2$ atmosphere. The solution was sprayed on hot substrate for 15 s to form a dark perovskite thin-film. 50 nm of Gold S/D contacts were then thermally evaporated on thin-film through a shadow mask, followed by Cytop deposition and top-contact evaporation, for which we followed the procedures similar to the spin-coated devices.

Example 4—Single Crystal Growth of MAPbBr$_3$ Bulk Crystals—from Solution

PbBr$_2$ and MABr (molar ratio 1:1) were used to prepare the precursor solution with a concentration of 0.5 M in DMF. The crystals were grown by the solvent exchange method, in which a vial of 5 mL precursor solution was placed in a closed container with 20 mL IPA as the anti-solvent. After 3-5 days, the anti-solvent slowly evaporated, and red-color crystals with 1-10 mm in size were obtained at the bottom of the vial. The crystals were further washed with IPA and dried in vacuum.

Example 5—Field Effect Transistor

Figure 10:
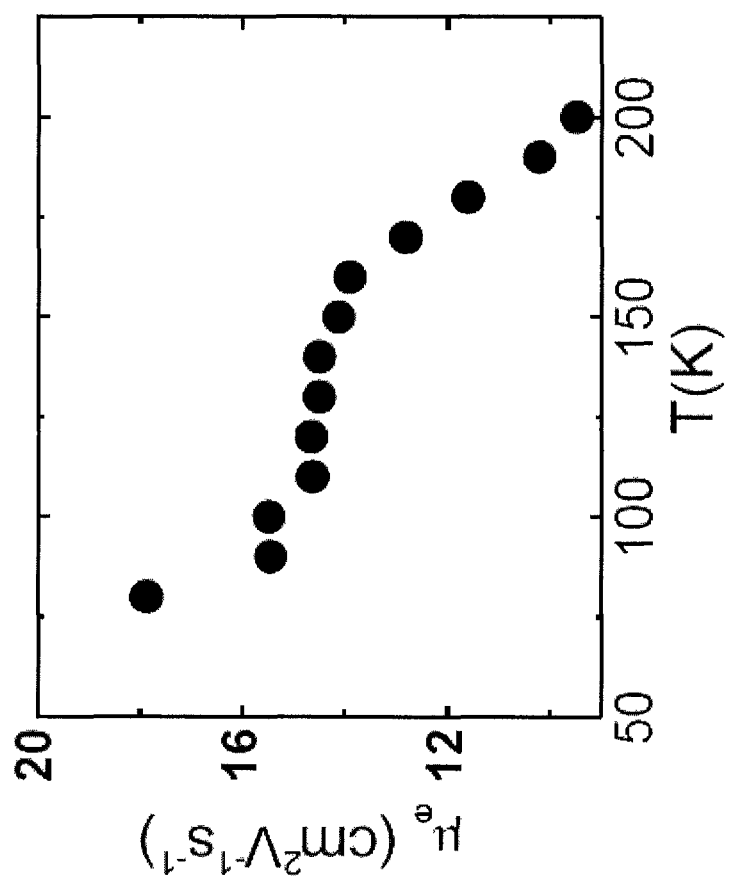
FIG. 10 illustrates carrier mobility as a function of temperature of a field effect transistor according to some embodiments.

A field effect transistor was fabricated as follows. A highly doped (n$^{++}$) bottom gate was provided and a SiO$_2$ gate dielectric was deposited on the bottom gate. Gold drain and source electrodes were deposited by thermal evaporation on the SiO$_2$ gate dielectric. The contact geometry was defined by photolithography and lift-off. The organic-inorganic perovskite channel layer (MAPbI$_3$) was spin coated onto the contacts and gate dielectric from DMF. The deposited channel layer was then annealed at 100° C. for 30 minutes to remove the residual solvent. Fluoropolymer (CYTOP®-Asahi Glass) layer was deposited on the perovskite channel layer from an undiluted solution by spin coating in a nitrogen glove-box. The device was subsequently annealed at 50° C. overnight in vacuum oven to ensure cross-linking of the dielectric layer. Finally, Au-top gate terminal was deposited by thermal evaporation through a shadow mask. Electron mobility (e) of the field effect transistor was tested over a temperature range of 75-200 K. The results are illustrated in FIG. 10. As provided in FIG. 10, p increased by an order of magnitude as temperature decreased from 200 K to 75 K.

Example 6—Field Effect Transistor

A field effect transistor employing a two-dimensional (2D) organic-inorganic perovskite channel layer was fabricated as follows in a bottom-contact, top-gate configuration. Gold drain and source electrodes were deposited by thermal evaporation on a substrate. The contact geometry was defined by photolithography and lift-off. The contact geometry can also be defined by shadow-mask. The deposited contacts were treated with pentafluorobenzenethiol (PFBT) or 2,3,5,6-tetrafluoro-4-(trifluoromethyl)benzenethiol (TTFB) by submersion of the entire device into a 30-50 mM bath of the self-assembly monolayer (SAM) dissolved in ethanol for 30 minutes. SAM deposition was completed with a thorough rinse with ethanol to ensure bulk layer removal. This step improved injection and film formation. The 2D perovskite layer was subsequently deposited. 2D perovskite precursor solution was made by mixing $C_6H_5C_2H_4NH_3I$ and PbI$_2$ with a molar ratio of 2:1 in dimethylformamide (DMF). Dimethylsulfoxide (DMSO) may also be used as solvent. Subsequently, the solution was spin-coated onto the FET substrate at 3000 rpm. A small amount of dichloromethane may be applied to facilitate the crystallization process during the spin coating process. The deposited channel layer was then annealed at 100° C. for 30 minutes to remove the residual solvent.

Notably, other organic ligands such as $C_6H_{13}NH_3^+$ and $C_{10}H_{21}NH_3^+$ can also be used to form 2D perovskite compounds. By mixing 2D ligands together with CH$_3$NH$_3^+$ in a certain ratio, multi-layers of [PbI$_4$]$^{2-}$ between two organic spacers are obtained. This type of mixed 2D perovskites can enhance FET performance. The charge transport in most 2D perovskites occurs perpendicular to the growth direction, mainly in the PbX$_4$ layer (where X is halogen).

In the following step, CYTOP® dielectric was spin-coated onto the surface of the 2D organic-inorganic perovskite channel layer. The dielectric film was then annealed at 110° C. for at least 1 hour. The FET device was completed by depositing the top-gate electrode of gold. Other conductive metal can be used for the top electrode such as silver or aluminum.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:
1. A field effect transistor comprising:
a source terminal, a drain terminal and a gate terminal;
a dielectric layer positioned between the gate terminal and the source and drain terminals; and
a channel layer in electrical communication with the source terminal and drain terminal, the channel layer comprising an organic-inorganic perovskite in contact with a polymeric surface of the dielectric layer, wherein the polymeric surface of the dielectric layer comprises amorphous polymer.

2. The field effect transistor of claim 1, wherein the organic-inorganic perovskite is an organic-inorganic halide perovskite.

3. The field effect transistor of claim 2, wherein the organic-inorganic halide perovskite has a mixed halide composition.

4. The field effect transistor of claim 2, wherein the organic-inorganic halide perovskite is of formula $ABX_{1-z}Y_z$, wherein A is an organic cation, B is an element selected from the group consisting of transition metals, Group IVA elements and rare earth elements and X and Y are independently selected from Group VIIA elements, wherein $0 \leq z < 1$.

5. The field effect transistor of claim 4, wherein the organic-inorganic halide perovskite is of formula $APbI_{1-z}Cl_z$.

6. The field effect transistor of claim 5, wherein A is selected form the group consisting of $NH_4^+$, $CH_3NH_3^+$, $CH_3CH_2NH_3^+$ and $NH_2CH=NH_2^+$.

7. The field effect transistor of claim 1, wherein the organic-inorganic perovskite is two-dimensional.

8. The field effect transistor of claim 1, wherein hole mobility ($\mu_h$) or electron mobility ($\mu_e$) increases with decreasing temperature of the channel layer.

9. The field effect transistor of claim 1, wherein $\mu_e$ is 10 cm$^2$/Vs to 200 cm$^2$/Vs.

10. The field effect transistor of claim 9 having threshold voltage ($V_T$) of 5V to 15V.

11. The field effect transistor of claim 1, wherein $\mu_h$ is 10 cm$^2$/Vs to 200 cm$^2$/Vs.

12. The field effect transistor of claim 11 having $V_T$ of −5V to −15V.

13. The field effect transistor of claim 1 having $\mu_e$ and $\mu_h$ of at least 1 cm$^2$/Vs.

14. The field effect transistor of claim 1 having a channel width of 200 μm to 1000 μm.

15. The field effect transistor of claim 1 having a channel length of 5 μm to 100 μm.

16. The field effect transistor of claim 1, wherein the channel layer has thickness 200 nm to 500 nm.

17. The field effect transistor of claim 1, wherein the organic-inorganic perovskite has grain size of at least 200 nm.

18. The field effect transistor of claim 1, wherein the organic-inorganic perovskite has grain size of 200 nm to 2 μm.

19. The field effect transistor of claim 1, wherein the organic-inorganic perovskite has surface roughness of 70 nm or less.

20. The field effect transistor of claim 1, wherein the amorphous polymer is fluoropolymer.

21. The field effect transistor of claim 1, wherein the polymeric surface of the dielectric layer comprises polymer electret.

22. The field effect transistor of claim 1, wherein the dielectric layer comprises two or more polymeric layers.

23. The field effect transistor of claim 22, wherein the dielectric layer exhibits a dielectric gradient.

24. The field effect transistor of claim 23, wherein a polymer electret layer contacts the organic-inorganic perovskite of the channel layer.

25. The field effect transistor of claim 1 further comprising a work function alteration layer positioned between the channel layer and at least one of the source terminal and drain terminal.

26. A field effect transistor comprising:
a source terminal, a drain terminal and a gate terminal;
a dielectric layer positioned between the gate terminal and the source and drain terminals;
a channel layer in electrical communication with the source terminal and drain terminal, the channel layer comprising an organic-inorganic perovskite in contact with a polymeric surface of the dielectric layer; and
a work function alteration layer positioned between the channel layer and at least one of the source terminal and drain terminal, wherein the work function alteration layer comprises a self-assembled monolayer of a fluorinated compound.

27. The field effect transistor of claim 26, wherein the fluorinated compound is a fluorinated thiol.

28. The field effect transistor of claim 27, wherein the fluorinated thiol is 2,3,5,6-tetrafluoro-4-(trifluoromethyl)benzenethiol.

29. A field effect transistor comprising:
a source terminal, a drain terminal and a gate terminal;
a dielectric layer positioned between the gate terminal and the source and drain terminals; and
a channel layer in electrical communication with the source terminal and drain terminal, the channel layer comprising an organic-inorganic perovskite in contact with a polymeric surface of the dielectric layer,
wherein the field effect transistor exhibits electron mobility ($\mu_e$) of 10-200 cm$^2$/Vs and a subthreshold swing (S) of less than about 1 V/dec for holes and electrons.

* * * * *